United States Patent
Sugiyama

(10) Patent No.: US 6,315,024 B1
(45) Date of Patent: Nov. 13, 2001

(54) MANUAL ELECTRONIC-PART MOUNTING APPARATUS AND METHOD

(75) Inventor: Osamu Sugiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/285,569

(22) Filed: Apr. 2, 1999

Related U.S. Application Data

(62) Division of application No. 08/843,756, filed on Apr. 21, 1997, now Pat. No. 5,942,083.

(30) Foreign Application Priority Data

Apr. 22, 1996 (JP) .................................................... 8-100348

(51) Int. Cl.⁷ ..................................................... B65C 9/08
(52) U.S. Cl. ........................... 156/565; 156/299; 156/297; 156/573
(58) Field of Search ..................................... 156/299, 297, 156/261, 573, 565, 564, 560, 559; 29/830, 831, 829, 832, 837, 840, 842, 846, 884, 740, 739; 221/93, 123, 124, 178, 179, 181

(56) References Cited

U.S. PATENT DOCUMENTS

| | | | |
|---|---|---|---|
| 4,127,432 | * 11/1978 | Kuwano et al. | 156/297 |
| 4,548,667 | 10/1985 | Wical | 156/556 |
| 4,951,388 | 8/1990 | Eguchi et al. | 156/578 |
| 5,336,357 | 8/1994 | Layher et al. | 156/578 |

* cited by examiner

Primary Examiner—Laura Edwards
(74) Attorney, Agent, or Firm—Frommer Lawrence & Haug, LLP.; William S. Frommer; Matthew K. Ryan

(57) ABSTRACT

A manual electronic-part mounting apparatus includes a manual adhesive coating apparatus, a manual electronic-part fitting apparatus, and a manual printed-wiring-board checking apparatus. The manual adhesive coating apparatus has a pressing plate portion to which a large number of needles are fitted, being arranged such that the needles with the adhesive are brought in contact with a printed-wiring board, thereby the adhesive being coated on predetermined positions of the printed-wiring board. The manual electronic-part fitting apparatus has a large number of electronic-part supply rods. The electronic-part supply rod has an electronic-part storage rod supported by a fixed plate and an extruding rod supported by a movable plate. When the movable plate is moved relative to the fixed plate, the chip-type electronic part is extruded from an end-portion side aperture of the electronic-part storage rod.

8 Claims, 15 Drawing Sheets

MANUAL ELECTRONIC-PART MOUNTING APPARATUS AND METHOD

This application is a division of U.S. application Ser. No. 08/843,756, filed Apr. 21, 1997, now U.S. Pat. No. 5,942,083.

BACKGROUND OF THE INVENTION

1. Field of the Invention

The present invention relates to an electronic-part mounting apparatus for mounting electronic parts on a printed-wiring board and more particularly to an electronic-part mounting apparatus for manually mounting chip-type electronic parts on a printed-wiring board.

2. Description of the Related Art

An electronic-part mounting apparatus for mounting electronic parts on a printed-wiring board, particularly an automatic electronic-part mounting apparatus for automatically mounting electronic parts are widely known.

An automatic electronic-part mounting apparatus will be described with reference to FIG. 1 by way of example. The automatic electronic-part mounting apparatus shown in FIG. 1 has an electronic-part supply device 210 for continuously supplying chip-type electronic parts, a mounting head 220 for carrying the electronic parts to a positioning position on a printed-wiring board 50 with holding the electronic parts by attraction, a positioning unit 221 for positioning the electronic parts at the positioning position, and an XY table 230 for supporting the printed-wiring board 50 so that the printed-wiring board 50 can be moved in the X and Y directions.

The chip-type electronic parts have various types or various shapes. Typically, the chip-type electronic parts have a rectangular shape and have, in view of a dimension, a width ranging from 1.0 to 1.2 mm, a length ranging from 1.8 mm to 2.0 mm and a height ranging from 0.4 to 0.5 mm.

The electronic-part supply device 210 employs a so-called carrier tape system. In the carrier tape system, the chip-type electronic parts are taped at a constant interval by a long carrier tape 211 wound around a reel. The carrier tape 211 is usually formed of two tapes, i.e., a top tape on its front side and a bottom tape on its rear side, and the electronic parts are supported while being gripped between the two tapes. A plurality of part cassettes 212 each including such reel are loaded onto the electronic-part supply device 210.

The electronic-part supply deice 210 may employ a system of supplying chip-type electronic parts individually housed in a bulk case other than the carrier tape system. The system of individually supplying the electronic parts is called a bulk feeder in which the electronic parts are housed in a plastic bulk case and the bulk case is loaded onto the electronic-part supply device.

The mounting head 220 has a rotary table 222 which can be rotated about a center axis and a plurality of attracting nozzles 223. The attracting nozzles 223 are fitted along a circumferential direction of the rotary table 222. As the rotary table 222 is rotated, the attracting nozzles 223 are also rotated. The attracting nozzles 223 are moved among an attracting position where the attracting nozzles 223 attract the electronic parts supported on the carrier tape 211, the positioning position where the positioning unit 221 positions the electronic parts, and a mounting position where the electronic parts are mounted on the printed-wiring board 50.

An operation of the automatic electronic-part mounting apparatus will subsequently be described. Initially, the printed-wiring board 50 is conveyed from a loading station onto the XY table 230. The attracting nozzle 223 located at the attracting position attracts the chip-type electronic parts, and the rotary table 222 is rotated. Thereafter, the attracting nozzle 223 is moved to the positioning position.

At the positioning position, the positioning unit 221 positions the electronic parts. When the operation of positioning the electronic parts is finished, the rotary table 222 is rotated and consequently the attracting nozzle 223 is moved to the mounting position. At the mounting position, the attracting nozzle 223 is lifted down to mount the electronic parts, which the attracting nozzle has held, on the printed-wiring board 50.

When the electronic parts are mounted on the printed-wiring board 50, the XY table 230 is moved to the next mounting position. When this operation is repeatedly carried out and consequently all the electronic parts have been mounted on the printed-wiring board, the printed-wiring board 50 is returned to the initial position. Finally, the printed-wiring board 50 is ejected from the XY table 230 to an unloading position. This sequential operation is repeated.

According to the automatic electronic-part mounting apparatus shown in FIG. 1, the chip-type electronic parts are successively mounted on the printed-wiring board 50 one by one. Every time when one of the chip-type electronic parts is mounted on the printed-wiring board, the attracting nozzle 223 must be lifted down and up. Thereafter, the rotary table 222 is rotated and then the attracting nozzle 223 is lifted down and up again. Operations of the attracting nozzle 223 and the rotary table 232 are carried out in a predetermined order.

In order to carry out efficiently the electronic-part mounting process, it is necessary to reduce a time required for mounting one electronic part. For this end, it may be sufficient to increase speeds of movements of the attracting nozzle 223 and the rotary table 222. However, even if the speeds are increased, it is impossible to reduce the time required for mounting one electronic part beyond a certain extent. Therefore, it is impossible to increase the speeds beyond the limit.

Even if the time required for mounting one electronic part can be reduced, a time required for carrying out the electronic-part mounting process becomes longer as the number of the electronic parts to be mounted on one printed-wiring board 50 is increased.

When the automatic electronic-part mounting apparatus shown in FIG. 1 is employed, if the number of the electronic parts to be mounted is increased or if it is necessary to carry out the mounting operation at higher speed, then the apparatus tends to become large in size and to become complicated, which requires more costs and limits a room where the apparatus is located.

Since the automatic electronic-part mounting apparatus shown in FIG. 1 is arranged so as to automatically mount the electronic parts on the printed-wiring board 50, the conventional automatic electronic-part mounting apparatus shown in FIG. 1 requires a drive mechanism and a control device, which complicates an arrangement of the automatic electronic-part mounting apparatus shown in FIG. 1 and makes a size thereof larger.

The automatic electronic-part mounting apparatus shown in FIG. 1 employs a process for checking the electronic parts mounted on the printed-wiring board 50. This checking process is carried out by using a considerable expensive apparatus utilizing a video processing technique, for example, or the like. Therefore, the automatic electronic-part mounting apparatus shown in FIG. 1 inevitably includes the disadvantage that its arrangement becomes complicated and hence costs of equipment is increased.

SUMMARY OF THE INVENTION

In view of such aspects, it is an object of the present invention to provide an electronic-part mounting apparatus which is arranged so as to be able to simultaneously mount a plurality of chip-type electronic parts on a printed-wiring board.

In view of such aspects, it is another object thereof to provide an electronic-part mounting apparatus having a small size and a simple arrangement.

According to a first aspect of the present invention, a manual adhesive coating apparatus includes a base plate having a supporting member for supporting a printed-wiring board and an adhesive storage groove for storing an adhesive, and a pressing plate portion to which a large number of needles are fitted, being arranged such that the needles are brought in contact with the adhesive stored in the adhesive storage groove to put the adhesive on the needles and the needles with the adhesive are brought in contact with the printed-wiring board supported by the supporting member, thereby the adhesive being coated on predetermined positions of the printed-wiring board.

According to a second aspect of the present invention, a manual electronic-part fitting apparatus includes a fixed plate, a movable plate which can be moved relative to the fixed plate, a supporting plate for supporting a printed-wiring board, and a large number of electronic-part supply rods, being arranged such that the electronic-part supply rod incorporates an electronic-part storage rod having an aperture for storing a large number of chip-type electronic parts piled in a line therein and an extruding rod disposed in the aperture, and that the electronic-part storage rod is supported by the fixed plate so that its first end portion should be located in the vicinity of a surface of a printed-wiring board supported by the supporting plate, the extruding rod is supported by the movable plate, and when the movable plate is moved relative to the fixed plate, the extruding rod is moved inward in the aperture of the electronic-part storage rod, thereby the chip-type electronic part being extruded from the side of the first end portion of the aperture.

According to a third aspect of the present invention, a manual electronic-part fitting apparatus includes a supporting member for supporting a printed-wiring board, a top plate disposed above the printed-wiring board and having a large number of apertures, and an electronic-part supply rod, being arranged such that the electronic-part supply rod incorporates an electronic-part storage rod having an aperture for storing a large number of chip-type electronic parts piled in a line therein and an extruding rod disposed in the aperture, and that the electronic-part storage rod is inserted into the aperture of the top plate so that its first end portion should be located in the vicinity of a surface of a printed-wiring board supported by the supporting plate, and the extruding rod is moved inward in the aperture of the electronic-part storage rod, thereby the chip-type electronic part being extruded from the side of the first end portion of the aperture.

According to a fourth aspect of the present invention, a checking apparatus includes a rod disposed so as to correspond to a position of a chip-type electronic part to be mounted on a printed-wiring board and so as to stand straight on the printed-wiring board, and a lamp disposed so as to correspond to the rod, being arranged such that the rod is disposed at either of a first position where it is located on the chip-type electronic part and a second position where it is not located on the chip-type electronic part, and the lamp corresponding to a rod located at the second position is turned on.

According to a fifth aspect of the present invention, a manual adhesive coating method includes the steps of putting an adhesive on a large number of needles fitted to a pressing plate portion, and of disposing the pressing plate portion so that it should be opposed to the printed-wiring board to thereby bring the needles with the adhesive in contact with the printed-wiring board.

According to a sixth aspect of the present invention, a manual electronic-part fitting method includes the steps of providing a large number of electronic-part supply rods each having an aperture for storing a large number of chip-type electronic parts piled in line therein and an extruding rod disposed in the aperture, of supporting the electronic-part storage rod so that a first end portion of the electronic-part storage rod should be located adjacent to a surface of a printed-wiring board, and of moving the extruding rod inward in the aperture of the electronic-part storage rod to thereby extrude the chip-type electronic part from the side of the first end portion of the aperture.

According to a seventh aspect of the present invention, a checking method includes the steps of disposing a rod so as to correspond to a position of a chip-type electronic part to be mounted on a printed-wiring board and so as to stand straight on the printed-wiring board, and of disposing a lamp so as to correspond to the rod. The rod is disposed at either of a first position where it is located on the chip-type electronic part and a second position where it is not located on the chip-type electronic part, and the lamp corresponding to a rod located at the second position is turned on.

DESCRIPTION OF THE PREFERRED EMBODIMENTS

Figure 2:
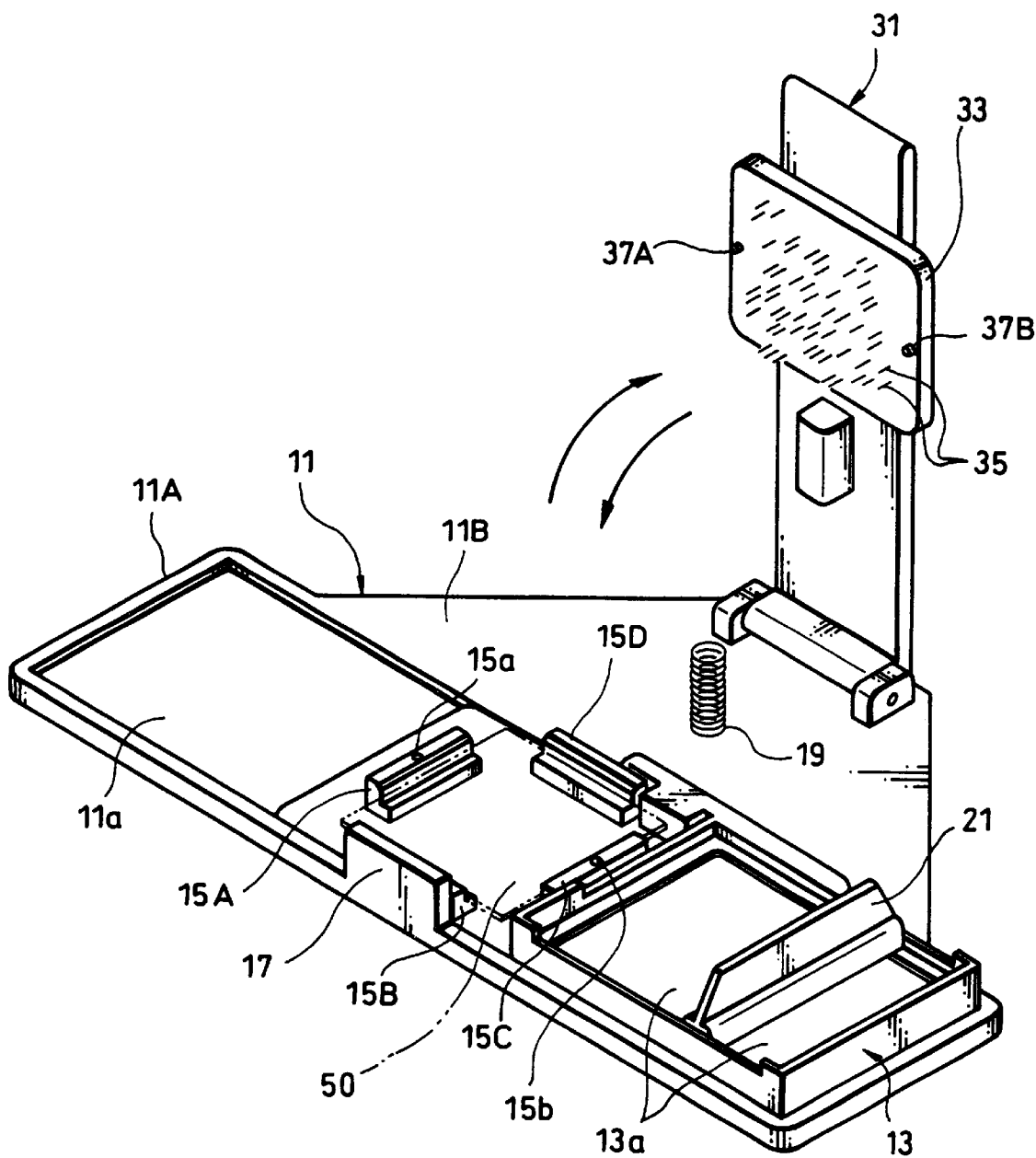
FIG. 2 is a perspective view of a manual adhesive coating apparatus of a manual electronic-part mounting apparatus according to an embodiment of the present invention, showing a state that a pressing plate portion is located at its standby state and a base plate is located at its adhesive coating position.
Figure 3:
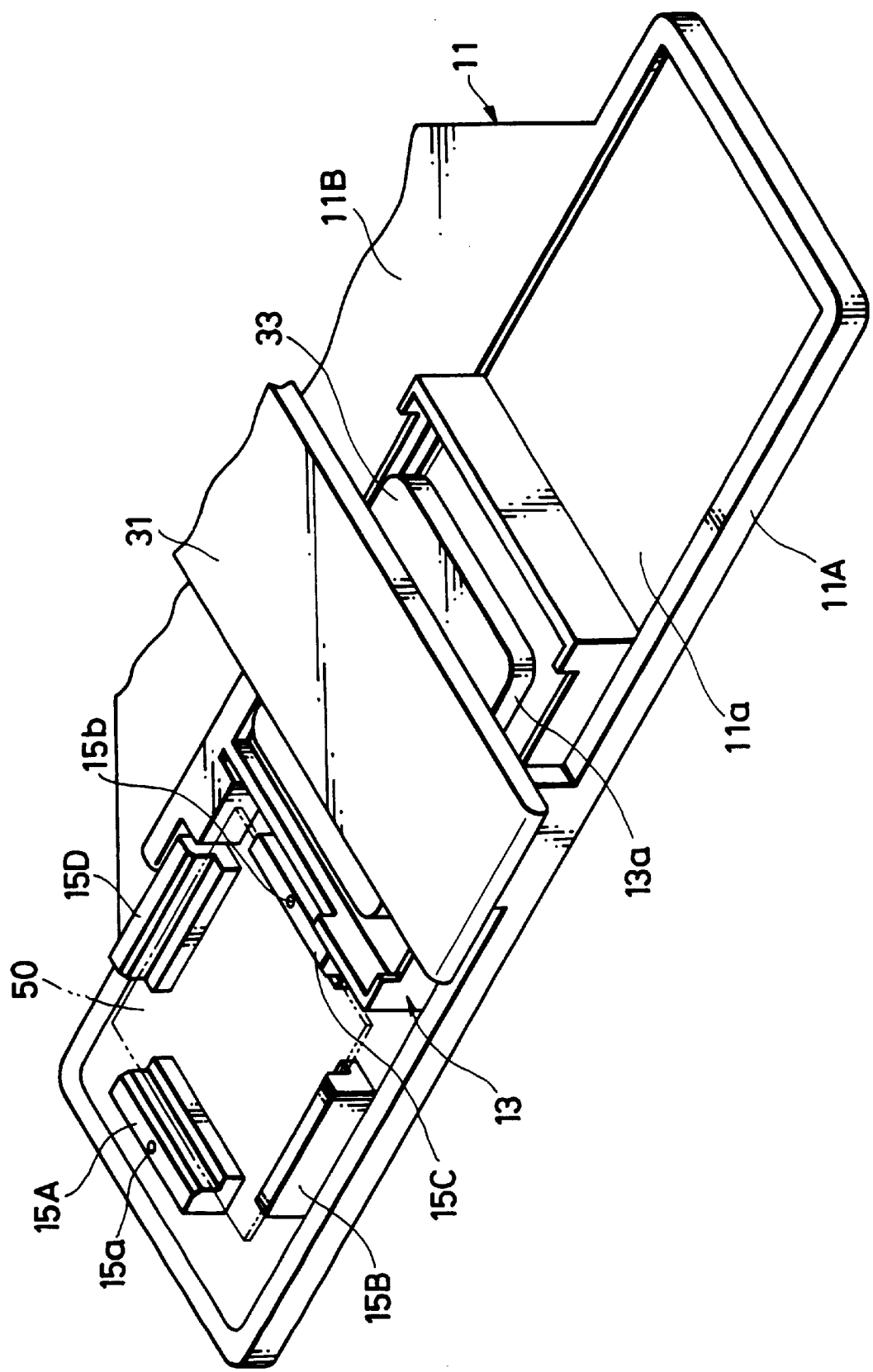
FIG. 3 is a diagram showing the manual adhesive coating apparatus of the manual electronic-part mounting apparatus according to the embodiment of the present invention in a state that the pressing plate portion is located at its pressed position and the base plate is located at its adhesive pickup position.
Figure 4:
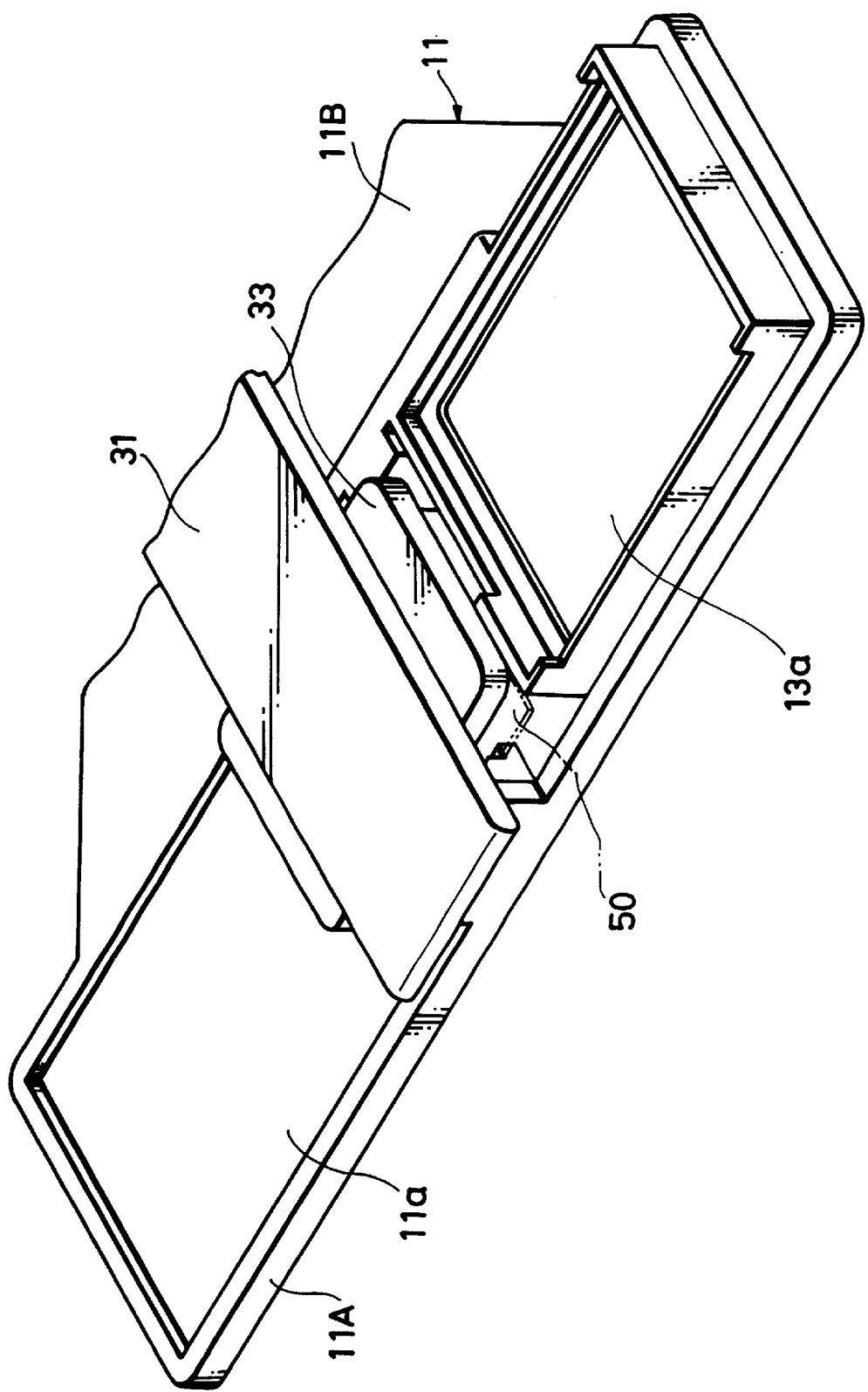
FIG. 4 is a diagram showing the manual adhesive coating apparatus of the manual electronic-part mounting apparatus according to the embodiment of the present invention in a state that the pressing plate portion is located at its pressed position and the base plate is located at its adhesive coating position.

A manual electronic-part mounting apparatus according to an embodiment according to the present invention will be described with reference to the drawings. FIGS. 2, 3 and 4 show a manual adhesive coating apparatus of the manual electronic-part mounting apparatus according to the embodiment of the present invention. The manual adhesive coating apparatus according to the embodiment has a base plate portion 11 and a pressing plate portion 31. The base plate portion 11 has a rectangular portion 11A and a trapezoid portion 11B.

The pressing plate portion 31 is pivotally mounted on the base plate portion 11 by some proper pivoting device. The pressing plate portion 31 can manually be moved between a standby position shown in FIG. 2 and a pressing position shown in FIGS. 3 and 4. For example, as shown in FIG. 2, the pivoting device may have pins provided at end portions of the pressing plate portion 31 and apertures which are provided through a trapezoid portion 11B of the base plate portion 11 and into which the pins are inserted.

The rectangular portion 11A of the base plate portion 11 has a shallow groove 11a formed on its upper surface. A rectangular base plate 13 is disposed in the groove 11a. A width of the base plate 13 is equal to that of the groove 11a, but a longitudinal-direction length of the base plate 13 is shorter than that of the groove 11a. The base plate 13 is arranged so that it can manually be slid in the longitudinal direction in the groove 11a. The base plate 13 can be moved between an adhesive pickup position located at the left side in the groove 11a shown in FIG. 3 and an adhesive coating position located at the right side in the groove 11a as shown in FIGS. 2 and 4.

Four supporting members 15A, 15B, 15C and 15D for supporting a printed-wiring board 50 (shown by a one-dot chain line in FIGS. 2, 3 and 4) are provided at the left side portion on an upper surface of the base plate 13. Each of the supporting members 15A to 15C has a shoulder portion for supporting the printed-wiring board 50. The two supporting members 15A and 15C have holes 15a and 15b, respectively.

A rectangular shallow concave portion, i.e., an adhesive storage groove 13a for storing an adhesive is formed at the right side portion on the upper surface of the base plate 13. As shown in FIG. 2, a leveller 21 may be used to flatten an upper surface of the adhesive stored in the adhesive storage groove 13a.

The rectangular portion 11A of the base plate portion 11 has a stopper 17 for being engaged with a head end portion of the pressing plate portion 31, the stopper 17 being provided at a position corresponding to the pressing plate portion 31. A spring 19 is provided on an upper surface of the trapezoid portion 11B.

A top plate 33 is fitted to the pressing plate portion 31. A large number of needles 35 are provided on the top plate 33. The top plate 33 is larger than the printed-wiring board 50 and has a dimension corresponding to an outer circumference of a square formed by the four supporting members 15A, 15B, 15C and 15D. The needles 35 are disposed at positions corresponding to positions of chip-type electronic parts to be mounted on the printed-wiring board 50. The top plate 33 have two projections 37A and 37B respectively provided along both side edges thereof.

An operation of the adhesive coating apparatus according to this embodiment will be described. In a state that the pressing plate portion 31 is in its standby state as shown in FIG. 2, the printed-wiring board 50 is disposed at the four supporting members 15A, 15B, 15C and 15D at the left side portion of the base plate 13. The printed-wiring board 50 is positioned by engaging respective four sides thereof with the shoulder portions of the four supporting members 15A, 15B, 15C and 15D.

An adhesive is put in the adhesive storage groove 13a at the right side portion of the base plate 13. The leveler 21 is manually traveled on the adhesive. A lower surface of the leveler 21 flattens an upper surface of the adhesive.

As shown in FIG. 3, the base plate 13 is slid toward the left side to the adhesive pickup position, and the pressing plate portion 31 is pressed down from its standby position to its pressed position. Until the upper end portion of the pressing plate portion 31 is brought in contact with the stopper 17, the pressing plate portion 31 is pivotally moved. When the pressing plate portion 31 is located at the pressed position, the needles 35 provided on the top plate 33 are soaked in the adhesive stored in the adhesive storage groove 13a. When the pressing plate portion 31 is located at the pressed position, the spring 19 is compressed.

The pressing plate portion 31 is returned from the pressed position to the standby position. When the pressing plate portion 31 is returned to the standby position, it is possible to utilize a spring force of the spring 19. In a state that the pressing plate portion 31 is returned to the standby position, the adhesive is put on the needles 35 of the top plate 33.

As shown in FIG. 4, the base plate 13 is slid in the right direction to the adhesive coating position, and then pressed down from its standby position to its pressed position. Until the upper end portion of the pressing plate portion 31 is brought in contact with the stopper 17, the pressing plate portion 31 is pivotally moved. This movement brings tip ends of the needles 35 in contact with the printed-wiring board 50, and consequently the adhesive put on the needles 35 is coated on the printed-wiring board 50.

Figures 14A, 14B:
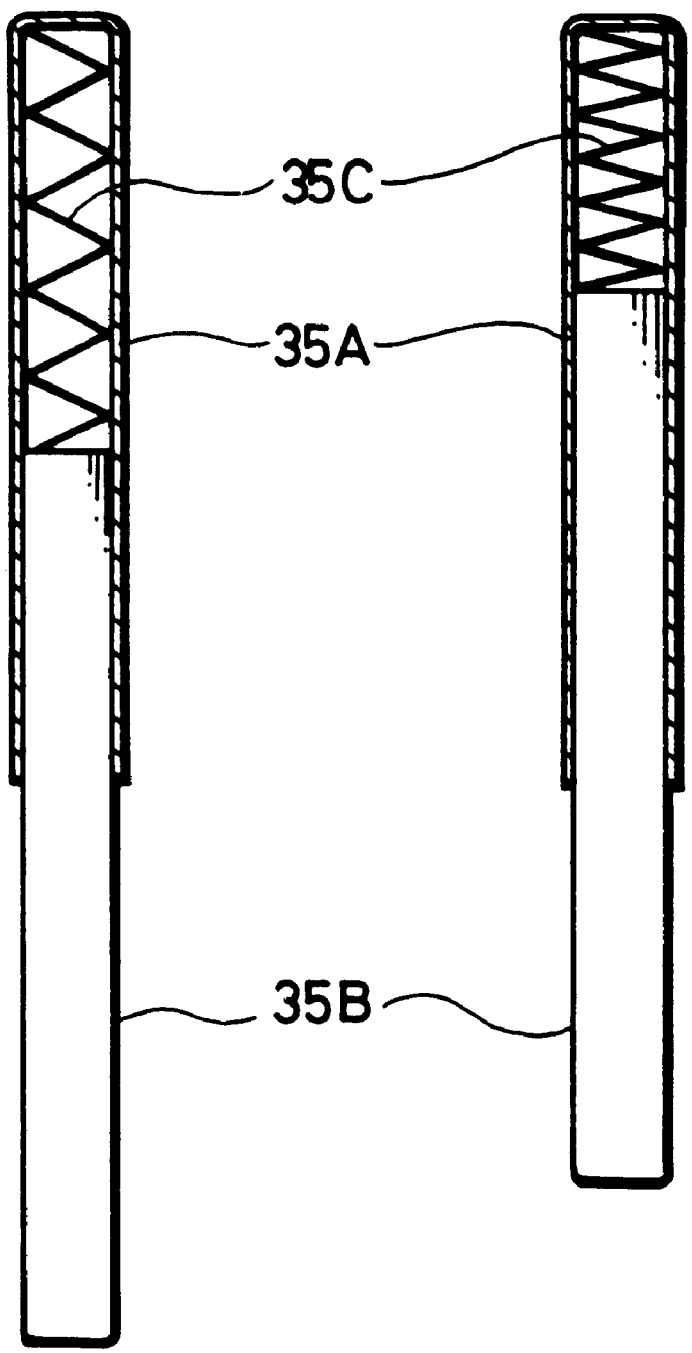
FIGS. 14A and 14B diagrams used to explain an example of an arrangement of needles provided on a top plate shown in FIG. 2.

A structure of the needle 35 will be described later on (see FIGS. 14A and 14B). Each of the needles 35 has a mechanism for constantly pressing its tip end on the printed-wiring board 50 with a constant force in order to prevent the tip end from damaging a surface of the printed-wiring board 50. Pins provided at the tip ends of the needles 35 are arranged so as to be inserted into sleeves buried in the top plate 33. When the tip ends of the needles 35 are brought in contact with the printed-wiring board 50, the pins at the tip ends of the needles 35 are relatively moved backward into the sleeves against spring forces of springs provided in the sleeves. Thus, the tip ends of the needles 35 are constantly pressed on the printed-wiring board 50 with a constant force by constant spring forces of the springs.

A pair of projections 37A, 37B provided on the top plate 33 are engaged with the holes 15a, 15b provided in the two supporting members 15A, 15C, respectively, thereby the top plate 33 being positioned relative to the printed-wiring board 50. Therefore, the adhesive is precisely coated on the printed-wiring board 50 at positions corresponding to the needles 35.

When the above operation of coating the adhesive is finished, the pressing plate portion 31 is returned from its pressed position to its standby position. Consequently, the adhesive coating process is finished and the printed-wiring board 50 is conveyed for the next process. If the position of the chip-type electronic part to be mounted on the printed-wiring board 50 is changed, it is sufficient to change the positions of the needles 35 provided on the top plate 33. The top plate 33 has small holes for holding the needles, and the needles 35 are held in the holes. Therefore, the positions of the needles can be changed.

The manual electronic-part mounting apparatus will be further described with reference to FIGS. 5, 6A, 6B, 7 and 8. FIGS. 5, 6A, 6B, 7 and 8 are diagrams showing a manual electronic-part fitting apparatus of the manual electronic-part mounting apparatus according to the embodiment of the present invention. The manual electronic-part fitting apparatus according to this embodiment has three fixed plates disposed in parallel to one another, i.e., a top plate 51, a middle plate 53 and a bottom plate 55, and one movable plate 57. The three fixed plates 51, 53 and 55 are supported by four column-shaped members 61A, 61B, 61C and 61D (column-shaped member 61D is not shown).

Figure 5:
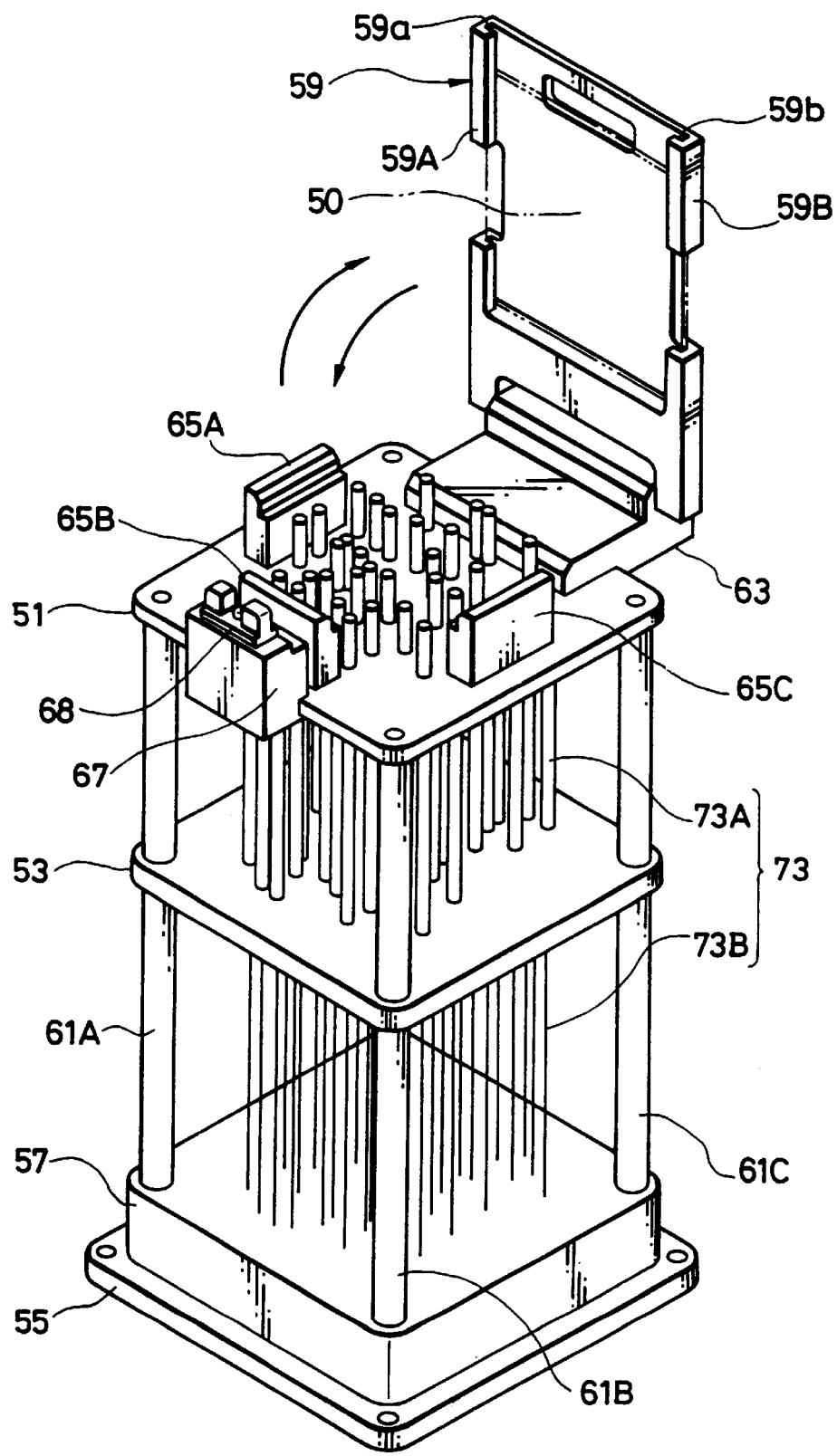
FIG. 5 is a diagram showing a manual electronic-part fitting apparatus of the manual electronic-part mounting apparatus according to the embodiment of the present invention in a state that a supporting plate is located at its opened standby position and a movable plate is located at its lower-side standby position.

A fitting member 63 is provided at an edge of the top plate 51. The fitting member 63 has a supporting plate 59 for supporting the printed-wiring board 50. The supporting plate 59 is pivotally provided at the fitting member 63 by some proper pivoting device. The pivoting device, as shown in FIG. 5, for example, may have pins provided at edges of the supporting plate 59 and holes which are formed through the fitting member 63 and into which the pins are inserted. The supporting plate 59 can manually pivotally be moved between its standby position shown in FIG. 5 and the mounting position shown in FIGS. 7 and 8.

The supporting plate 59 has some proper holding device for holding the printed-wiring board 50. In this embodiment, projection portions 59A and 59B are provided at both of edges of the supporting plate 59. Grooves 59a and 59b are formed along the projection portions 59A and 59B, respectively. Both of the edges of the printed-wiring board 50 are engaged with the grooves 59a, 59b, respectively.

Three supporting members 65A, 65B, 65C for supporting the printed-wiring board 50 (shown by one-dot chain line in FIGS. 5, 7 and 8) are provided on an upper surface of the top plate 51. Each of the supporting members 65A, 65B, 65C has a shoulder portion for supporting the printed-wiring board 50. A stopper 67 is provided on the upper surface of the top plate 51 adjacent to the supporting member 65B.

The stopper 67 has a shoulder portion for supporting an edge of the supporting plate 59 and a rotary member 68 rotatably provided thereon.

Figure 7:
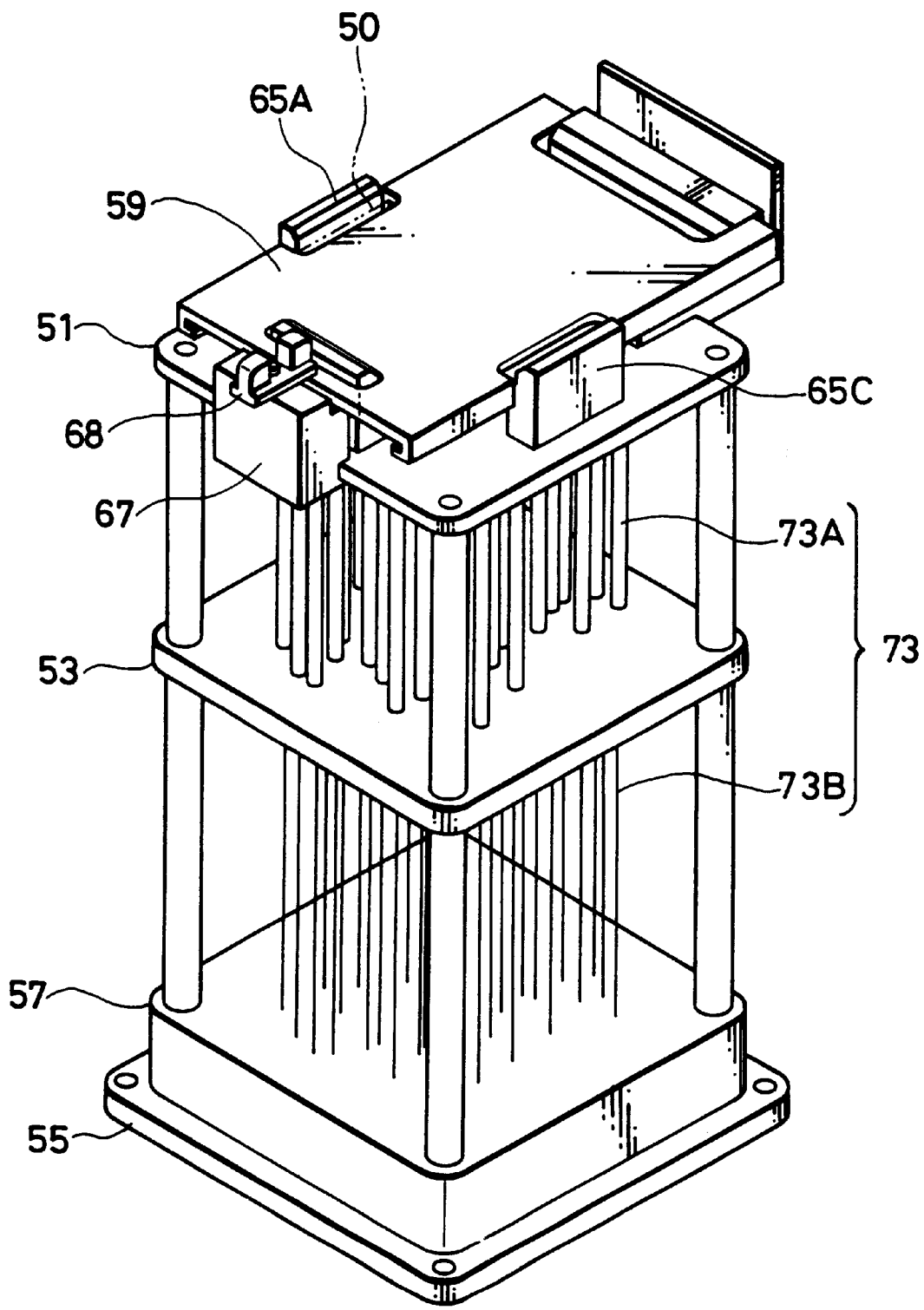
FIG. 7 is a diagram showing the manual electronic-part fitting apparatus of the manual electronic-part mounting apparatus according to the embodiment of the present invention in a state that the supporting plate is located at its closed fitting position and the movable plate is located at its lower-side standby position.
Figure 8:
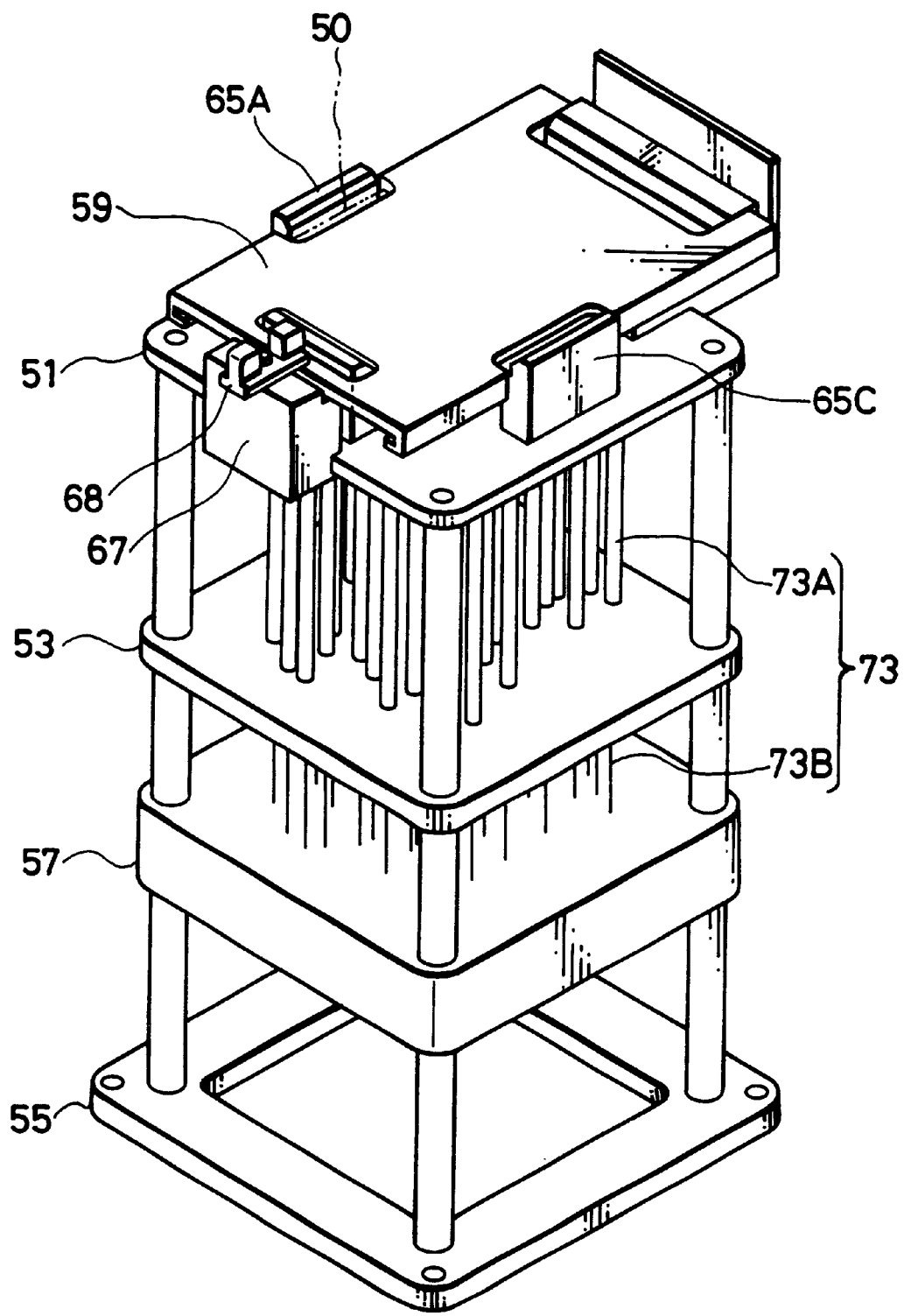
FIG. 8 is a diagram showing the manual electronic-part fitting apparatus of the manual electronic-part mounting apparatus according to the embodiment of the present invention in a state that the supporting plate is located at its closed fitting position and the movable plate is located at its upper-side fitting position.

A large number of long electronic-part supply rods 73 extended through the top plate 51 and the middle plate 53 to the movable plate 57 are disposed as shown in FIGS. 5, 7 and 8. The electronic-part supply rods 73 are disposed so as to correspond to positions of the chip-type electronic parts to be mounted on the printed-wiring board 50. Therefore, the electronic-part supply rods 73 are disposed so as to correspond to the positions of the needles 35 (see FIG. 2) provided on the top plate 33 of the manual adhesive coating apparatus.

A structure of the electronic-part supply rod 73 will be described in detail with reference to FIGS. 6A and 6B. Each of the electronic-part supply rods 73 has a long electronic-part supply storage rod 73A made of plastic and an extruding rod 73B made of some proper metal such as stainless steel, for example.

The electronic-part storage rod 73A has an aperture 73a having a cross section corresponding to a shape of an electronic part. If a square electronic part is stored, then the cross section of the aperture 73a is a square, and if a rectangular electronic part is stored, then the cross section of the aperture 73a is a rectangular. As shown in FIGS. 6A and 6B, a large number of chip-type electronic parts 75 are loaded in the aperture 73a of the electronic-part storage rod 73A so as to be successively piled and arranged in line.

A holding member 73C having a cross section of the same shape as that of the cross section of the aperture 73a is disposed under the piled chip-type electronic parts 75. The holding member 73C is held by friction force between it and an inner surface of the aperture 73a, and is held at its present position if it is not applied with an external force. Therefore, the holding member 73C allows the piled chip-type electronic parts 75 to be held in the aperture 73a of the electronic-part storage rod 73A without falling down.

The extruding rod 73B is inserted into the aperture 73a of the electronic-part storage rod 73A from its lower-side opening, and disposed so that its tip end should be located under the holding member 73C.

Figures 6A, 6B:
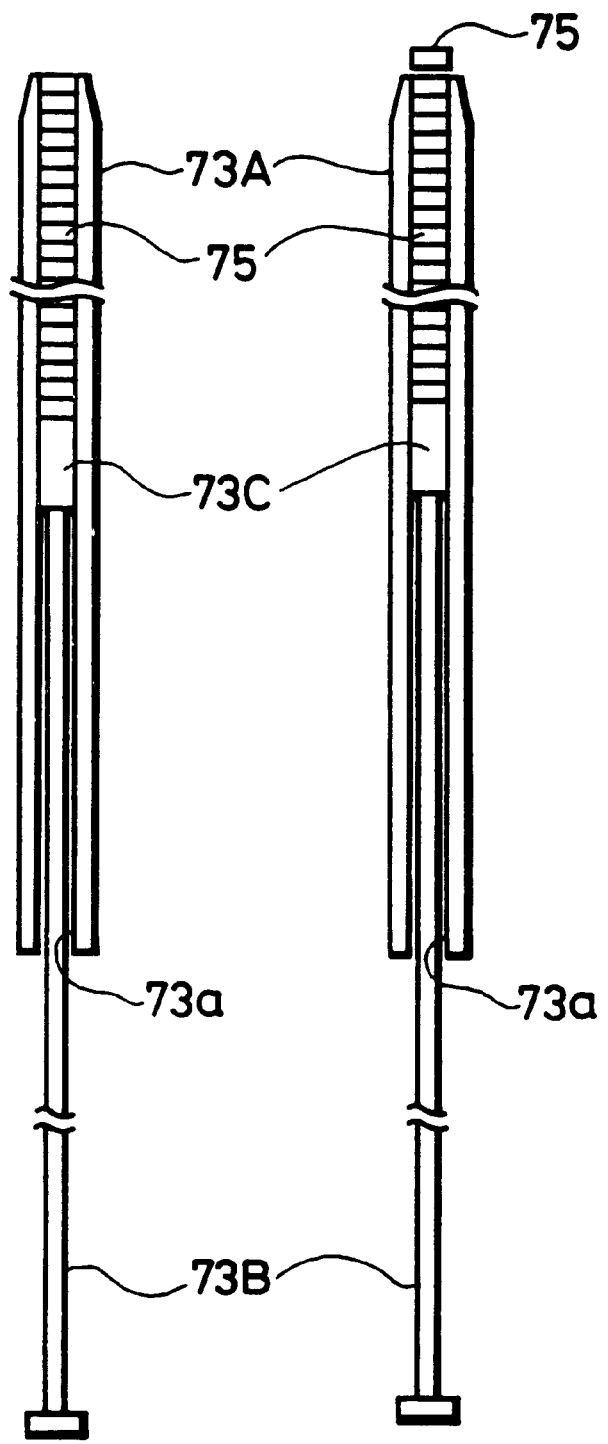
FIGS. 6A and 6B are diagrams showing an arrangement of an electronic-part supply rod of the manual electronic-part fitting apparatus shown in FIG. 5, by way of example.

When the extruding rod 73B is moved upward from a state shown in FIG. 6A, the holding member 73C is also moved upward and consequently the piled electronic parts 75 are moved upward. As a result, as shown in FIG. 6B, the upper most one of the piled electronic parts 75 is extruded from an upper-side opening of the aperture 73a of the electronic-part storage rod 73A.

The manual electronic-part fitting apparatus will be described with reference to FIG. 5 again. The electronic-part storage rod 73A of the electronic-part supply rod 73 is fixed and supported by the top plate 51 and the middle plate 53, and the tip end of the electronic-part storage rod 73A of the electronic-part is slightly projected from the upper surface of the top plate 51. A lower end of the extruding rod 73B is fixed on the movable plate 57.

The movable plate 57 is connected to some proper drive apparatus, not shown, and can be moved in the upward and downward directions thereby. Such drive apparatus may have an air cylinder or a hydraulic cylinder or may be an electric or magnetic drive apparatus such as a solenoid.

The movable plate 57 is arranged so that it can be moved between its lower-side standby position shown in FIGS. 5 and 7 and its upper-side fitting position shown in FIG. 8 both of which are located between the middle plate 53 and the bottom plate 55.

When the movable plate 57 is moved upward from its standby position to its fitting position, the extruding rod 73B fitted to the movable plate 57 is moved upward. Since the electronic-part storage rod 73A is fixed, the extruding rod 73B is moved upward in the aperture 73*a* of the electronic-part storage rod 73A and the chip-type electronic parts 75 piled and stored in the electronic-part storage rod 73A are raised. Consequently, the uppermost one of the chip-type electronic parts 75 is extruded from the upper end of the electronic-part supply rod 73.

The electronic-part supply rod 73 has a mechanism for constantly pressing the chip-type electronic part on the printed-wiring board 50 with a constant force. A lower end of the extruding rod 73B is arranged so as to be inserted into a sleeve of the movable plate 57. A structure of the extruding rod 73B will be described later on (with reference to FIGS. 14A and 14B). When the movable plate 57 is moved upward and consequently the uppermost chip-type electronic part stored in the electronic-part storage rod 73A is brought in contact with the printed-wiring board 50, the extruding rod 73B is prevented from being moved upward further. Therefore, the extruding rod 73B is relatively moved backward into the sleeve against a spring force of a spring disposed in the sleeve. Thus, the chip-type electronic part is pressed onto the printed-wiring board 50 by a constant force resulting from the spring force of the spring.

An operation of the manual electronic-part fitting apparatus according to this embodiment will be described. As shown in FIG. 5, in a state that the supporting plate 59 is located at its standby position, the printed-wiring board 50 is fitted to and held by the supporting plate 59. As described above, both-side edges of the printed-wiring board 50 are engaged with the grooves 59*a*, 59*b* formed along the projection portions 59A, 59B, respectively.

As described with reference to FIGS. 2 to 4, the adhesive is previously coated on the printed-wiring board 50 by using the manual adhesive coating apparatus according to the embodiment. As shown in FIG. 7, the supporting plate 59 is manually pivotally moved from its standby position to its fitting position. As shown in FIG. 7, the rotary member 68 fitted to the stopper 67 is rotated, thereby the supporting plate 59 being fixed.

Thus, the supporting plate 59 is held at its fitting position. At this time, the tip end of the supporting plate 59 is in contact with the shoulder portion of the stopper 67 and the three sides of the printed-wiring board 50 are respectively engaged with the shoulder portions of the three supporting members 65A, 65B, 65C, thereby the printed-wiring bard 50 being positioned.

As shown in FIG. 8, the movable plate 57 is lifted up from the lower-side standby position to the upper-side fitting position. As described above, it is by the drive apparatus connected to the movable plate 57 that the movable plate 57 is moved. When the movable plate 57 is lifted up, the extruding rod 73B of the electronic-part supply rod 73 fitted to the movable plate 57 is also lifted up. Since the electronic-part storage rod 73A of the electronic-part supply rod 73 is fixed on the two plates 51, 53, the extruding rod 73B is moved upward in the aperture 73*a* of the electronic-part storage rod 73A and consequently the uppermost electronic part 75 of the electronic parts 75 stored in the electronic-part storage rod 73A is extruded from the upper end of the aperture 73*a* and then pressed onto the printed-wiring board 50.

Since the adhesive is coated on the printed-wiring board 50 at the positions corresponding to the electronic-part supply rods 73, the electronic parts 75 are adhered to the printed-wiring board 50 by the adhesive. Thus, according to this embodiment, it is possible to mount a large number of electronic parts 75 on the printed-wiring board 50 simultaneously. When the chip-type electronic parts 75 are mounted on the printed-wiring board 50, the movable plate 57 is lifted down from the upper-side fitting position to the lower-side standby position. Subsequently, the rotary member 68 is rotated, thereby the supporting plate 59 being pivotally moved from the fitting position to the standby position. Then, the printed-wiring board 50 can be detached from the supporting plate 59.

The electronic-part supply rod 73 has a predetermined outside diameter and are prevented from being located at an interval between the adjacent electronic-part supply rods 73 which cannot be set smaller than a predetermined interval. Therefore, it is impossible to set an interval between the electronic parts 75 mounted on the printed-wiring board 50 smaller than a predetermined interval. If it is necessary to mount the electronic parts 75 on the printed-wiring board 50 at high density, the manual electric-part fitting apparatus according to this embodiment may be used to mount the electric parts 75 on the same printed-wiring board 50 plural times. In this case, the electric-part supply rods 73 are disposed at positions which are different from those where the electric-part supply rods 73 are previously located.

Thus, the adhesive is put on the printed-wiring board 50 by the adhesive coating apparatus according to this embodiment and the chip-type electronic parts 75 are mounted on the printed-wiring board 50 by the chip-type electronic-part fitting apparatus according to this embodiment described with reference to FIGS. 5, 6A, 6B, 7 and 8. Then, the process of fitting the electronic parts 75 is completed.

The chip-type electronic parts 75 may be mounted on one surface of the printed-wiring board 50 or both of surfaces thereof. When the chip-type electronic parts are mounted on both of the surfaces, the above fitting process is repeatedly carried out. The printed-wiring board 50 thus subjected to the above fitting process is conveyed for the next process, i.e., a soldering process. In the soldering process, the soft soldering operation is carried out by a reflowing furnace, for example.

A loading apparatus for loading the chip-type electronic parts 75 into the electronic-part supply rod 73 will be described with reference to FIGS. 9A and 9B by way of example. In this embodiment, the chip-type electronic parts 75 held on the carrier tape are loaded into the electronic-part supply rod 73 by an attraction nozzle 223. The loading apparatus according to this embodiment may employ the electronic-part supply device 210 and the attraction nozzle 223 both of which have been described with reference to FIG. 1.

Figure 1:
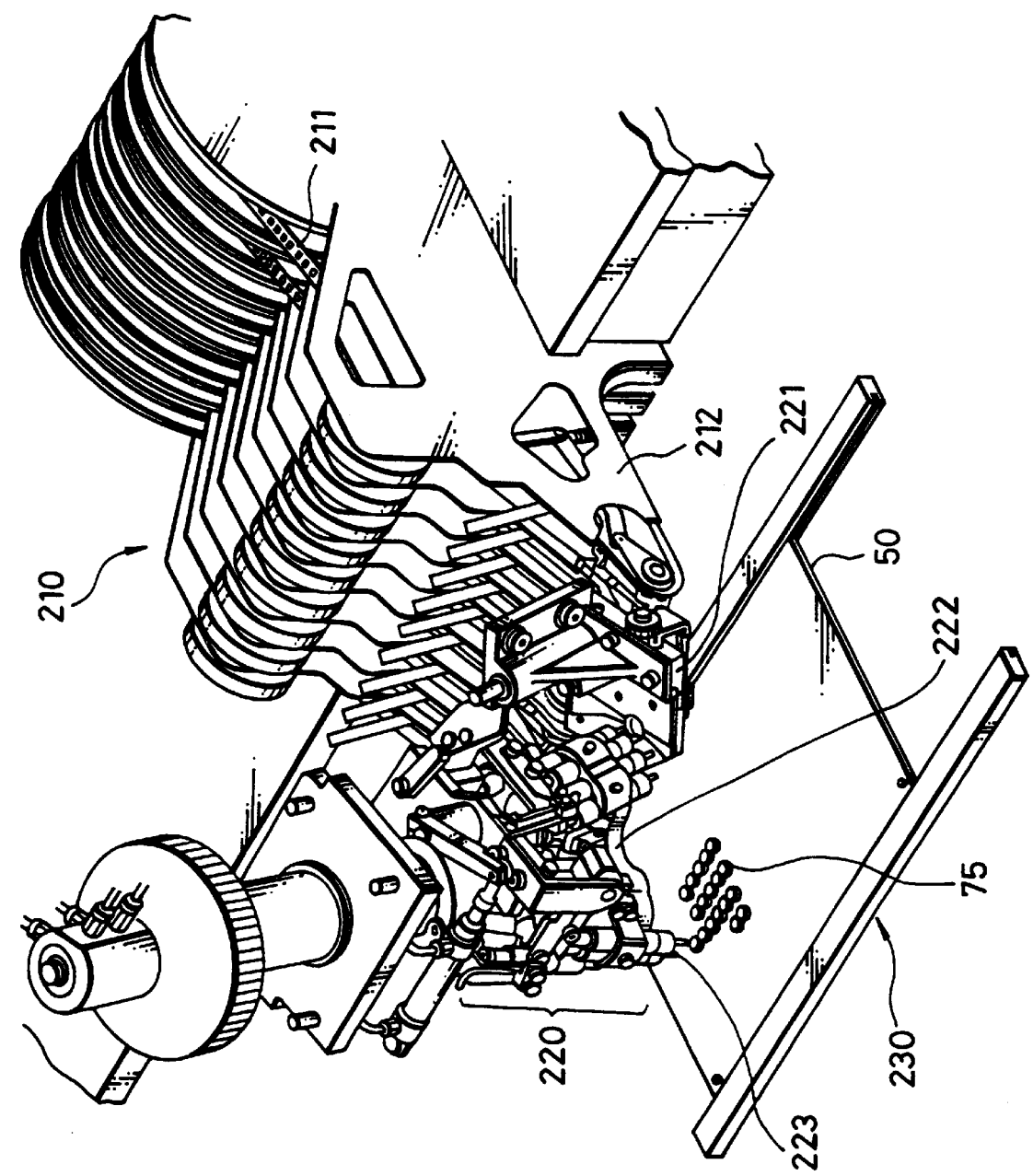
FIG. 1 is a diagram used to explain an automatic electronic-part mounting apparatus.

The carrier tape is drawn from a part reel rotatably supported by a part cassette, not shown, (see FIG. 1). A carrier tape 211 shown in FIG. 1 is formed of an upper-side top tape (not shown) and a lower-side bottom tape 211A, and the electronic parts 75 are held between the upper-side top tape and the lower-side bottom tape 211A. When the carrier tape is drawn from the part reel, the upper-side top tape is taken up, only the lower-side bottom tape 211A holding the chip-type electronic parts 75 is drawn therefrom.

Figure 9A:
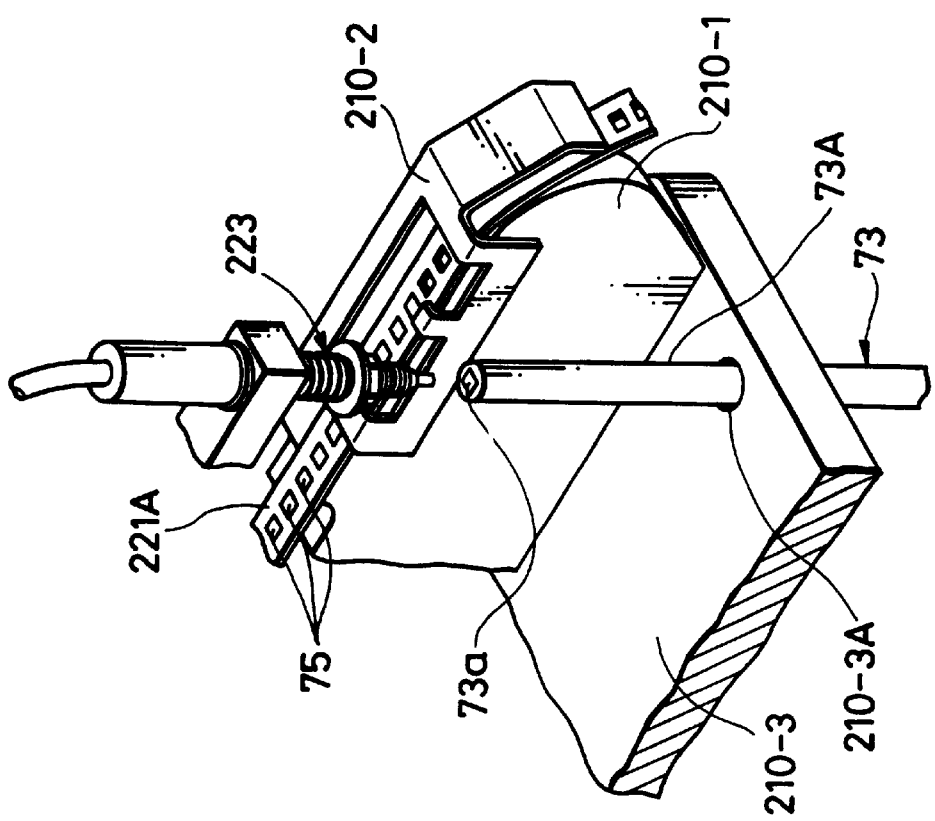
FIGS. 9A and 9B are diagrams showing a structure and an operation of a chip-type electronic-part loading apparatus of the manual electronic-part mounting apparatus according to the embodiment of the present invention.
Figure 9B:
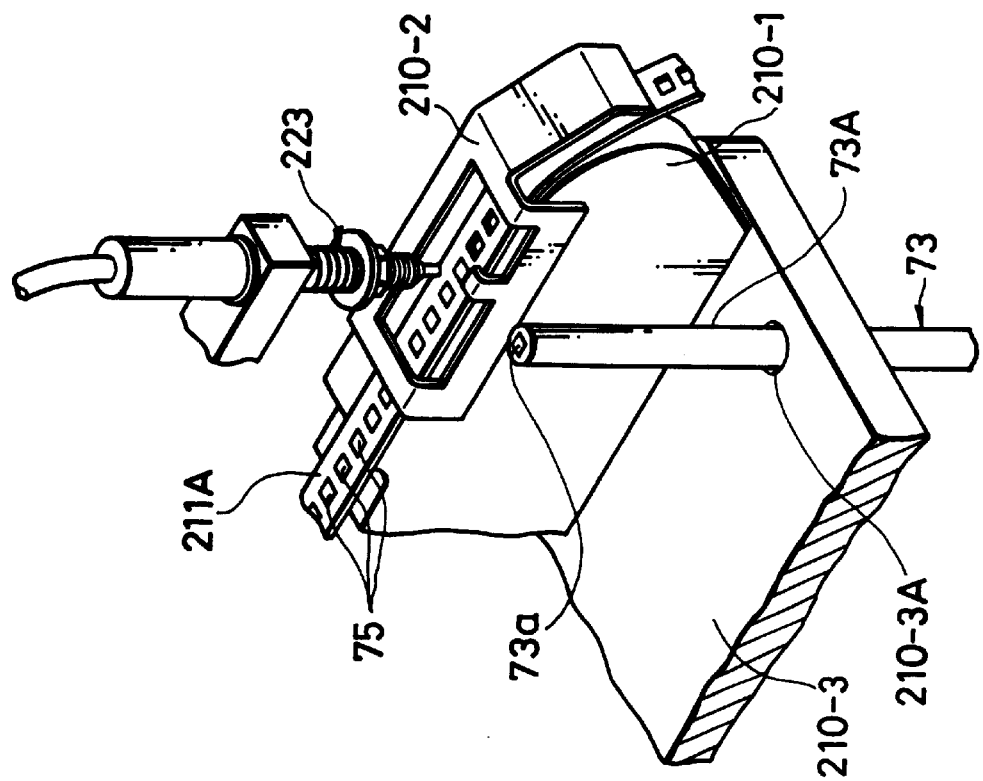

FIGS. 9A and 9B are diagrams showing the bottom tape 211A drawn to a tip end portion of the electronic-part supply device 210. The tip end portion of the electronic-part supply device 210 has a supporting stand 210-1 and a supporting metallic part 210-2 disposed on the supporting stand 210-1. The bottom tape 211A is held between the supporting stand 210-1 and the supporting metallic part 210-2.

The electronic-part supply rod 73 is disposed adjacent to the bottom tape 211A and supported by some proper supporting device. The electronic-part supply rod 73 is inserted into an aperture 210-3A of a supporting plate 210-3 and supported by the supporting plate 210-3. The attraction nozzle 223 is arranged so as to reciprocate between an attraction position located above the bottom tape 211A as shown in FIG. 9A and a loading position located above the electronic-part supply rod 73 as shown in FIG. 9B. The attraction nozzle 223 can further be moved upward and downward at both of the attraction position and the loading position.

An operation of the loading apparatus according to this embodiment will be described. As shown in FIG. 9A, the attraction nozzle 223 is disposed at the attraction position, being lifted down thereat to attract the chip-type electronic part 75. The attraction nozzle 223 is lifted up with holding the electronic part 75 at its lower end by attraction. Subsequently, the attraction nozzle 223 is moved to the loading position as shown in FIG. 9B, being lifted down thereat to load the chip-type electronic part 75 into the electronic-part supply rod 73.

The electronic-part loading apparatus according to this embodiment has some proper mechanism for transmitting a lateral-direction movement of the attraction nozzle 223 to a carrier-tape feeding mechanism. When the attraction nozzle 223 is moved between the attraction position and the loading position, the bottom tape 211A is fed by one pitch amount. Such operation is repeated, thereby the chip-type electronic parts 75 being loaded into the electronic-part supply rod 73.

Figure 10A:
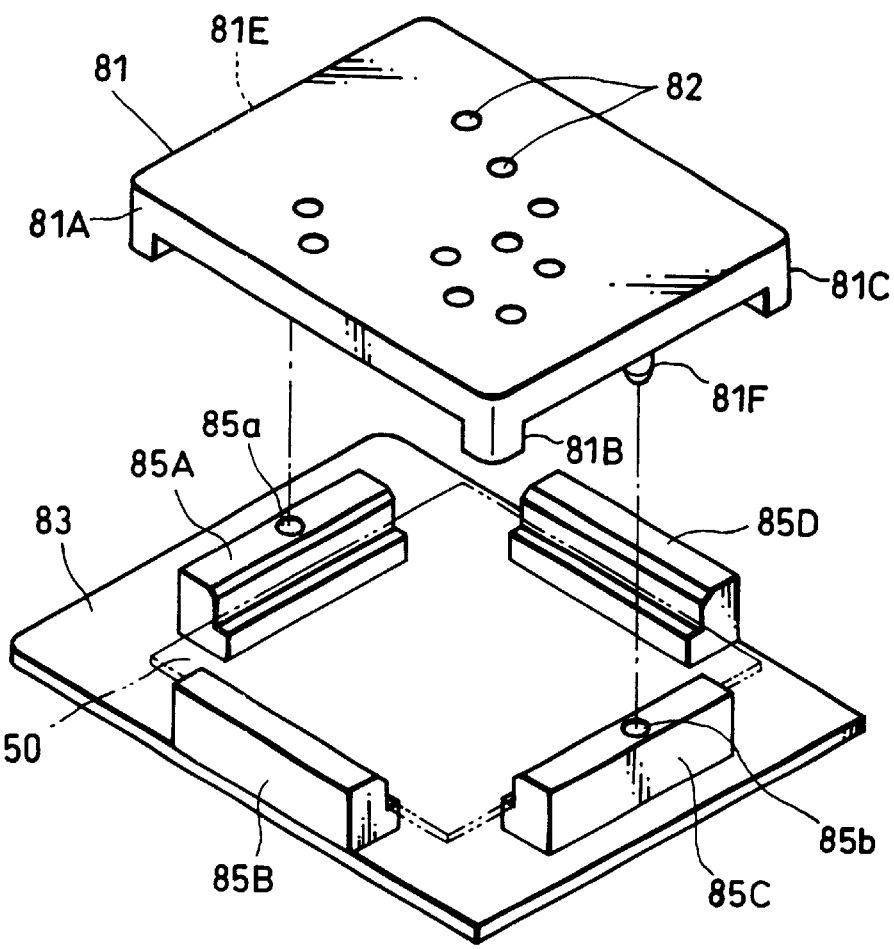
FIGS. 10A and 10B are diagrams showing a structure and an operation of a manual electronic-part fitting apparatus according to a second embodiment of the present invention.

An electronic-part fitting apparatus according to a second embodiment of the present invention will be described with reference to FIGS. 10A and 10B. According to the second embodiment, the electronic-part fitting apparatus has a top plate 81 and a bottom plate 83. Four supporting members 85A, 85B, 85C and 85D for supporting the printed-wiring board 50 (shown by one-dot chain line in FIGS. 10A and 10B) on an upper surface of the bottom plate 83. These supporting members 85A, 85B, 85C and 85D may respectively have the same structures as those of the four supporting members 15A, 15B, 15C and 15D described with reference to FIG. 2.

The top plate 81 has a large number of apertures formed therethrough and used for inserting the electronic-part supply rods 73 thereinto. The apertures 82 are defined so as to correspond to the positions of the chip-type electronic parts 75 to be mounted on the printed-wiring board 50.

The top plate 81 has four supporting members 81A, 81B, 81C and 81D (supporting member 81D is not shown in FIGS. 10A and 10B) fitted to its four corners and positioning projections 81E and 81F (positioning projection 81E is not shown in FIGS. 10A and 10B) provided at both side edges. The positioning projections 81E and 81F are engaged with holes 85a and 85b provided at the corresponding supporting members 85A and 85C, respectively.

An operation of the electronic-part fitting apparatus according to the second embodiment will be described. As shown in FIG. 10A, the printed-wiring board 50 is mounted on four supporting members 85A, 85B, 85C and 85D of the bottom plate 83. The printed-wiring board 50 is positioned by respectively engaging its four sides with shoulder portions of the four supporting members 85A, 85B, 85C and 85D. The adhesive is previously coated on the printed-wiring board 50 by using the manual adhesive coating apparatus according to this embodiment as described with reference to FIGS. 2 to 4.

Figure 10B:
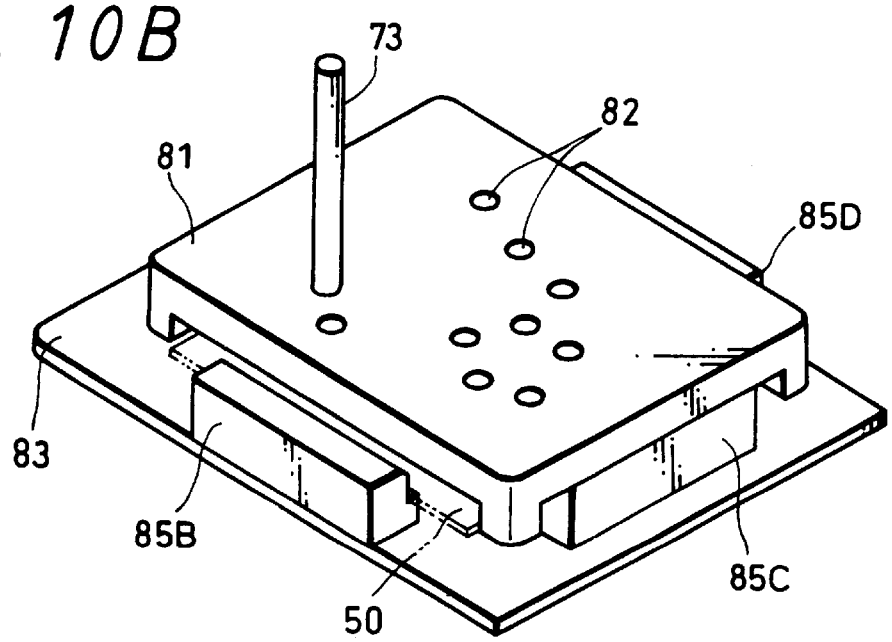

Subsequently, as shown in FIG. 10B, the top plate 81 is disposed on the printed-wiring board 50. The four supporting members 81A, 81B, 81C and 81D of the top plate 81 are disposed on the upper surface of the bottom plate 83. At this time, the positioning projections 81E and 81F are respectively engaged with the holes 85a and 85b of the supporting members 85A and 85C, thereby the top plate 81 being positioned.

The electronic-part supply rod 73 is inserted into the aperture 82 of the top plate 81. The electronic-part supply rod 73 is inserted into the aperture 82 such that the electronic-part storage rod 73A is located at the lower side and the extruding rod 73B is located at the upper side. The electronic-part storage rod 73A is disposed so that its tip end should be disposed sufficiently close to the surface of the printed-wiring board 50, and then the extruding rod 73B is pressed downward. In the second embodiment, the extruding rod 73B is manually extruded. As the result of the extrusion, the chip-type electronic-part 75 is extruded from the tip end of the electronic-part storage rod 73A, and the lowermost chip-type electronic part 75 of the chip-type electronic-part storage rod 73A is mounted on the printed-wiring board 50.

The above operation is repeatedly carried out. Specifically, the electronic-part supply rod 73 is inserted into another aperture 82 of the top plate 81 and the extruding rod is pressed downward, thereby the chip-type electronic part 75 being mounted on the printed-wiring board 50. A plurality of electronic-part supply rods 73 are simultaneously inserted into the apertures 82 of the top plate 81, then their extruding rods 73B being simultaneously pressed downward.

Figure 11:
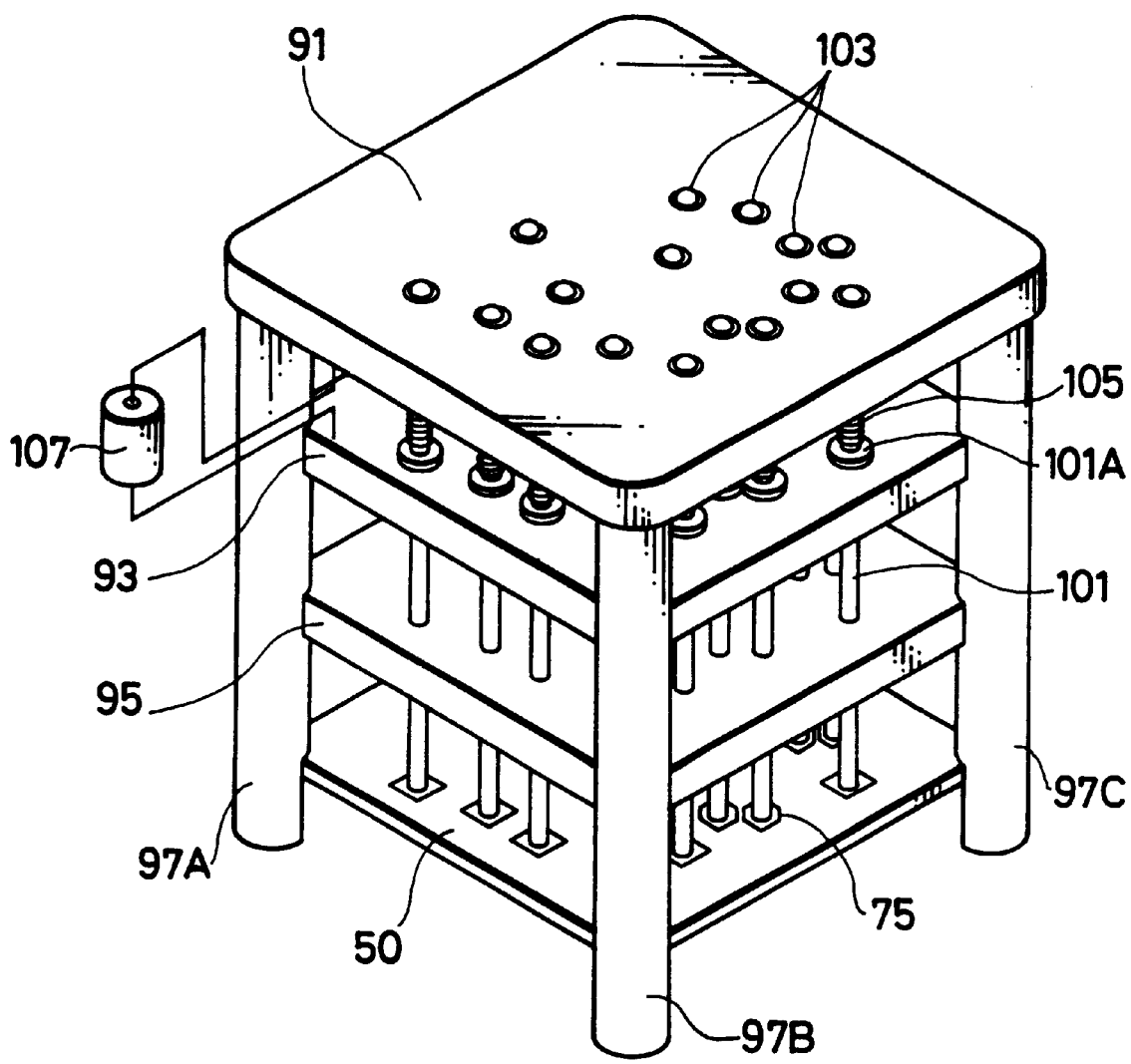
FIG. 11 is a perspective view of a manual electronic-part checking apparatus of the manual electronic-part mounting apparatus according to the embodiment of the present invention.
Figure 12:
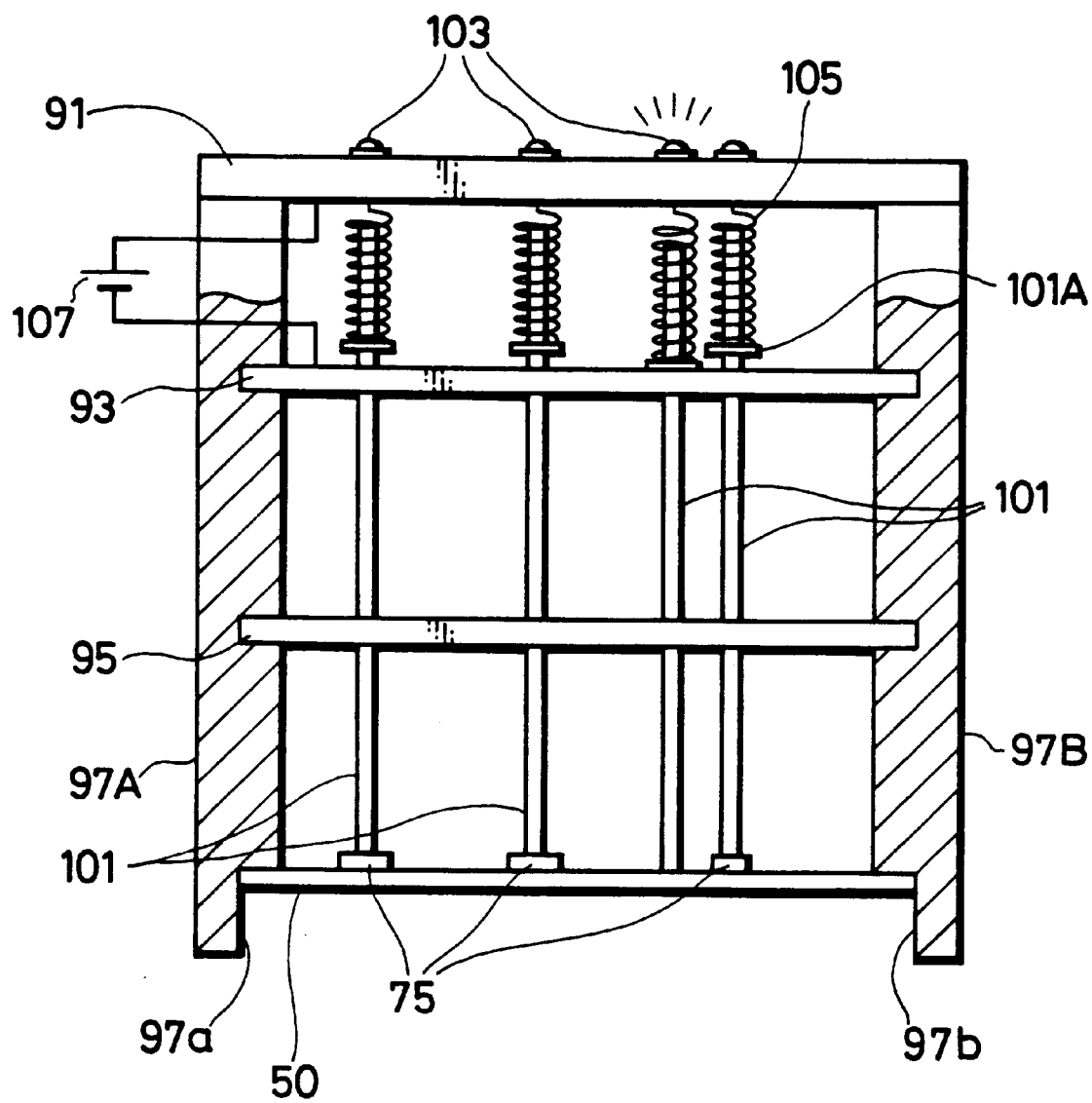
FIG. 12 is a front view of the manual electronic-part checking apparatus of the manual electronic-part mounting apparatus according to the embodiment of the present invention.

An arrangement and an operation of a manual printed-wiring-board checking apparatus according to the embodiment will be described with reference to FIGS. 11 to 13. The checking apparatus according to the embodiment checks whether or not the chip-type electronic parts 75 are mounted on respective predetermined positions of the printed-wiring board 50. An arrangement of the checking apparatus according to the embodiment will be described with reference to FIGS. 11 and 13. The checking apparatus according to the embodiment has a top plate 91, a middle plate 93 and a bottom plate 95, and these three plates 91, 93, 95 are supported by four column-shaped members 97A, 97B, 97C and 97D (column-shaped member 97D is not shown in FIGS. 11 and 12).

The printed-wiring board 50 to be checked is disposed below the checking apparatus so that its surface to be checked should be faced upward. As clearly shown in FIG. 12, the four column-shaped members 97A, 97B, 97C and 97D have shoulder portions 97a, 97b (only two shoulder portions are shown in FIG. 12) formed at their lower end portions, respectively. The printed-wiring board 50 is engaged with these shoulder portions.

The checking apparatus according to the embodiment further has a large number of rods 101 which are pierced through the middle plate 73 and the bottom plate 75 and can be moved in the upward and downward directions, and a large number of lamps 103 disposed on an upper surface of the top plate 91 so as to correspond to the above rods. Each of the lamps 103 may include a laser light emitting diode, for example. These rods 101 and lamps 103 are disposed so as to correspond to the chip-type electronic parts 75 to be mounted on the printed-wiring board 50.

The rod 101 has a guard-like member 101A, the guard-like member 101A being made of a conductive material, e.g., copper. The guard-like member 101A is disposed above the middle plate 93. The guard-like member 101A is electrically connected to the lamp 103 through some proper electric wire 105.

The checking apparatus according to this embodiment will be described with reference to FIG. 13. Copper foils 92, 94 are respectively coated on a lower surface of the top plate 91 and an upper surface of the middle plate 93. A chamfered portion 93B may be provided at an upper-side opening of an aperture 93A of the middle plate 93. The copper foil 94 is not coated on the chamfered portion 93B.

Of two terminals 103A, 103B of the lamp 103, the one terminal 103A is connected to the copper foil 92, and the other terminal 103B is connected to the electric wire 105. Both of the copper foils 92, 94 are respectively connected to both side terminals of a battery 107.

Figure 13:
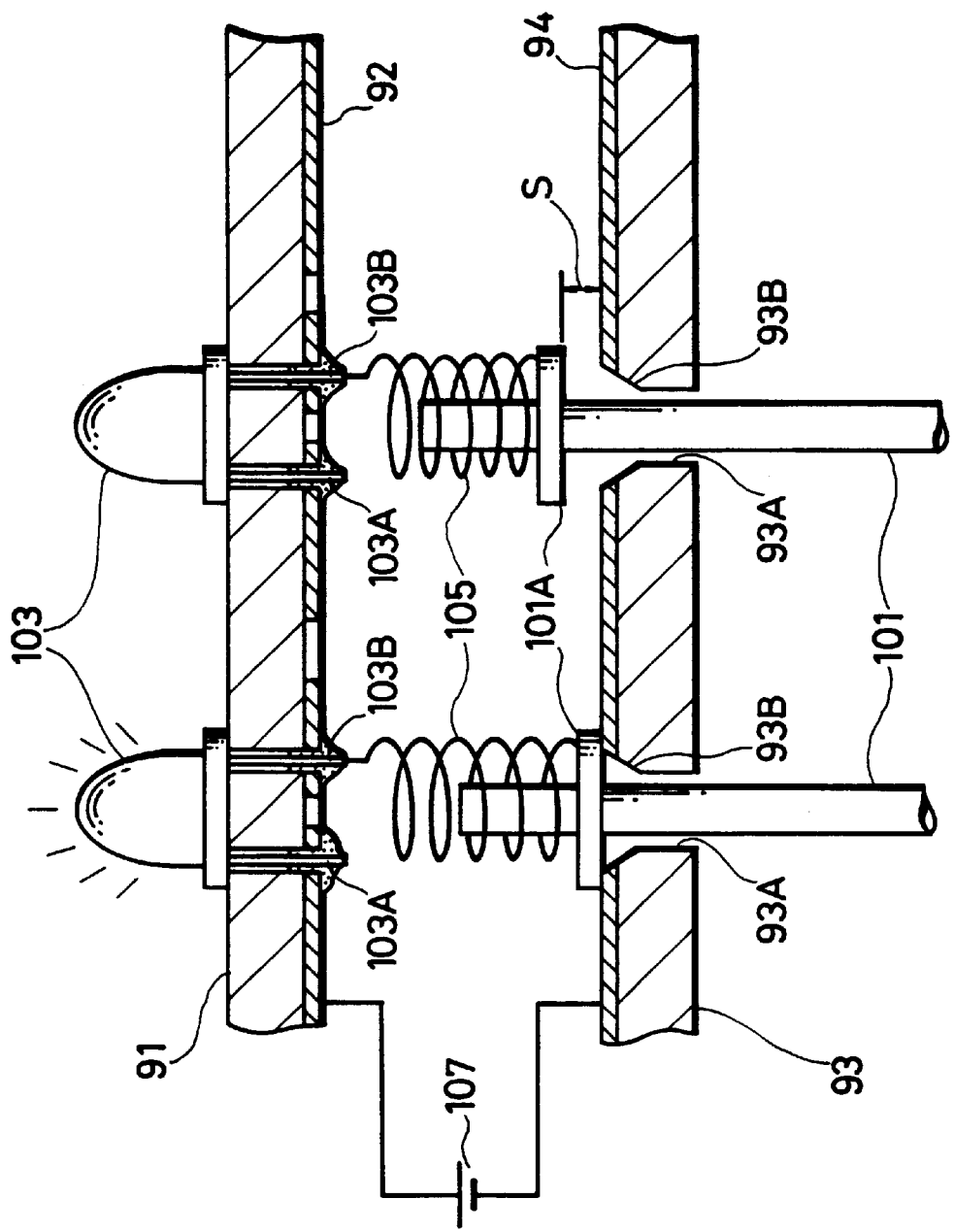
FIG. 13 is a partial, detailed diagram used to explain an operation of the manual electronic-part checking apparatus of the manual electronic-part mounting apparatus according to the embodiment of the present invention.

The rod 101 can be moved between a first position on the upper side (the rod 101 on the right side in FIG. 13) and a second position on the lower side (the rod 101 on the left side in FIG. 13). At the first position, the guard-like member 101A is located away from the copper foil 94 disposed on the upper surface of the middle plate 93. At the second position, the guard-like member 101A is in contact with the copper foil 94 disposed on the upper surface of the middle plate 93.

At the second position, since the first terminal 103A of the lamp 103 is electrically connected through the copper foil 92 to the one terminal of the battery 107 and the second terminal 103B of the lamp 103 is electrically connected to the other terminal of the battery 107 through the electric wire 105, the guard-like member 101A and the copper foil 94, the lamp 103 is turned on. At the first position, since the first terminal 103A of the lamp 103 is electrically connected through the copper foil 92 to the one terminal of the battery 107 but the second terminal 103B of the lamp 103 is not electrically connected to the other terminal of the battery 107 due to electrical interruption between the guard-like member 101A and the copper foil 94, the lamp 103 is not turned on.

The lower end of the rod 101 is disposed on a surface to be checked of the printed-wiring board 50. When the lower end of the rod 101 is located on the chip-type electronic part 75, the rod 101 is located at the first position, while when the lower end thereof is not located on the chip-type electronic part 75, the rod 101 is located at the second position. Therefore, when the rod 101 is located at the first position, i.e., when the lower end thereof is in contact with the chip-type electronic part 75, the lamp 103 is not turned on. On the other hand, when the rod 101 is located at the second position, i.e., when the lower end thereof is in contact with the chip-type electronic part 75, the lamp 103 is turned on.

Since the lamp 103 is located at a position corresponding to the position where the chip-type electronic part 75 is to be mounted on the printed-wiring board 50, it can be determined that the chip-type electronic part 75 is not mounted at a position where the lamp 103 is turned on.

A vertical position of the rod 101 at the first position is different from a vertical position of the rod 101 at the second position by a thickness of the chip-type electronic part 75. For example, if the thickness of the chip-type electronic part 75 is 0.4 mm, the rod 101 at the first position is located at a higher vertical position than a vertical position of the rod 101 at the second position by 0.4 mm. Therefore, the guard-like member 101A of the rod 101 at the second position is in contact with the copper foil 94 disposed on the middle plate 93, and the guard-like member 101A of the rod 101 at the first position is located at a higher vertical position by 0.4 mm as compared with that of the copper foil 94 disposed on the middle plate 93.

The printed-wiring board 50 disposed so as to be engaged with the shoulder portions 97a, 97b, 97c and 97d respectively provided on bottom edges of the four column-shaped members 97A, 97B, 97C and 97D is moved upward by an amount of a predetermined stroke S. The stroke S corresponds to the thickness of the chip-type electronic part 75 and may be 0.4 mm, for example.

A structure of the needle 35 used in the top plate 33 (shown in FIG. 2) will be described with reference to FIGS. 14A and 14B. The needle 35 has a sleeve portion 35A, a rod portion 35B disposed in the sleeve portion 35A, and a spring 35C. One end of the spring 35C is connected to a bottom of the sleeve portion 35A, and the other end thereof is connected to an inside end of the rod portion 35B. The sleeve portion 35A is fitted into a hole provided in the top plate 33.

When, as shown in FIG. 4, the pressing plate portion 31 is located at its pressed position and the needles 35 of the top plate 33 are pressed on the printed-wiring board 50, an inward force is applied to a tip end of the rod portion 35B. At this time, from a state that the rod portion 35B is biased outward by the spring 35C as shown in FIG. 14A, the rod 35B is pushed into the sleeve portion 35B against a spring force of the spring 35C. Further, the rod portion 35B is pressed onto the printed-wiring board 50 by a compressive force of the spring 35C.

A force transmitted from the needle 35 to the printed-wiring board 50 is not a force obtained by manually pressing the pressing plate portion 31 but the compressive force of the spring 35C. Therefore, even if the pressing plate portion 31 is pressed down with an intensive force, then the surface of the printed-wiring board 50 can be prevented from being damaged.

The movable plate 57 also has a structure similar to that of the needle 35 described with reference to FIGS. 14A and 14B. As described above, the electronic-part supply rod 73 has the electronic-part storage rod 73A and the extruding rod 73B. One end of the extruding rod 73B is disposed in the electronic-part storage rod 73A, and the other end thereof is fitted to the movable plate 57. The sleeve portion 35B of the needle 35 is fitted to a hole provided in the movable plate 57, and the rod portion 35B of the needle 35 is connected to the other end of the extruding rod 73B.

When the movable plate 57 is moved from the lower-side standby position to the upper-side fitting position, the extruding rod 73B of the electronic-part supply rod 73 is lifted up and consequently one chip-type electronic part 75 is extruded from the upper-side opening of the aperture 73a of the electronic-part storage rod 73A. The chip-type electronic part 75 thus extruded is pressed onto the surface of the printed-wiring board 50.

A force transmitted from the chip-type electronic part 75 to the printed-wiring board 50 is not a force from the movable plate 57 resulting from a drive apparatus but the compressive force of the spring 35C. Therefore, even if the force of the drive apparatus is strong, then the force transmitted from the chip-type electronic part 75 to the printed-wiring board 50 is constant and hence the surface of the printed-wiring board 50 can be prevented from being damaged.

Figure 15A:
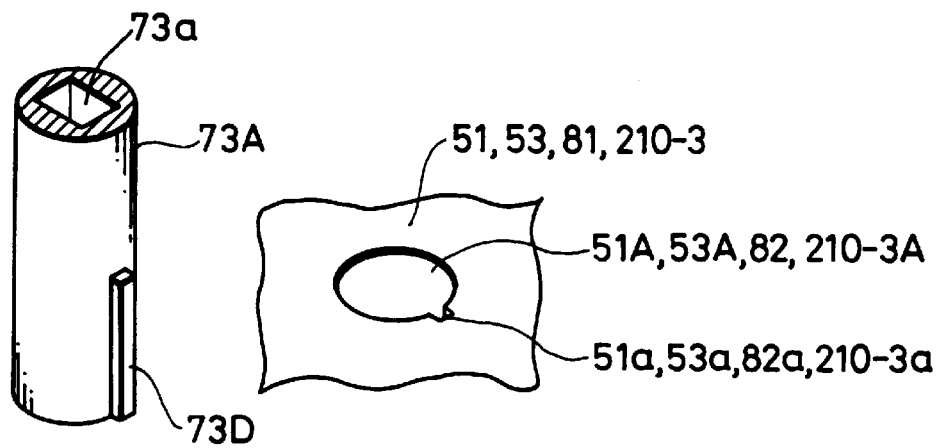
FIGS. 15A to 15C are diagrams showing a method of indicating a rotation position of the electronic-part supply rod.
Figure 15B:
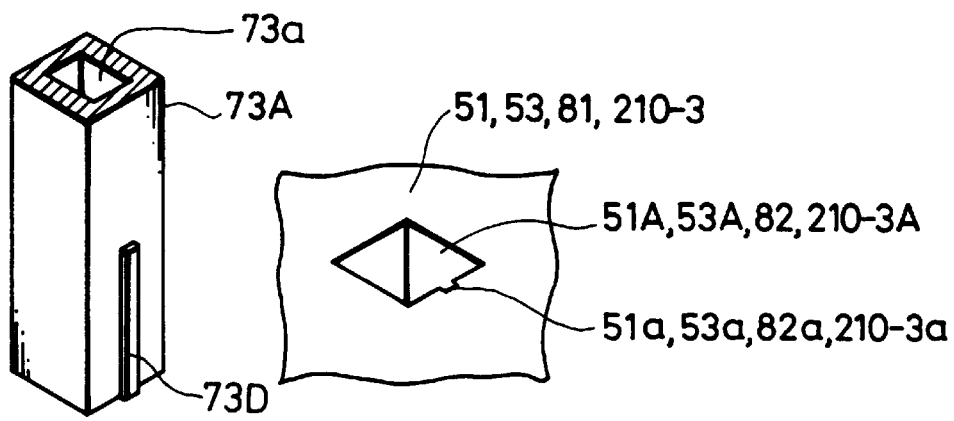

A method of indicating a rotation position of the electronic-part supply rod 73 will be described with reference to FIGS. 15A to 15C. As described with reference to FIGS. 5, 7 and 8, the electronic-part supply rod 73 is inserted into respective apertures 51A, 53A of the top plate 51 and the middle plate 53. As described with reference to FIGS. 9A and 9B, the electronic-part supply rod 73 is inserted into the aperture 210-3A of the supporting plate 210-3 of the chip-type electronic-part loading apparatus. As described with reference to FIGS. 10A and 10B, the electronic-part supply rod 73 is inserted into the aperture 82 of the top plate 81.

Shapes of the apertures 51A, 53A, 82 and 210-3A into which the electronic-part supply rod 73 is inserted correspond to a shape of a cross section of the electronic-part storage rod 73A. The shape of the cross section of the electronic-part storage rod 73A may be a circle as shown in FIG. 15A or a square as shown in FIGS. 15B and 15C. The shape may be a rectangular, though not shown.

A means is provided which indicates or fixes a rotation direction of the electronic-part storage rod 73A so that the electronic-part storage rod 73A should be disposed in the predetermined rotation direction. Each of the electronic-part storage rods 73A shown in FIGS. 15A and 15B has a projection portion 73D on its outer periphery surface, and grooves 51a, 53a, 82a, 210-3a are respectively provided at the apertures 51A, 53A, 82 and 210-3A of the top plate 51, the middle plate 53, the top plate 81 and the supporting plate 210-3. When the electronic-part storage rod 73A is inserted into the apertures 51A, 53A, 82, 210-3A, the projection portion 73D is engaged with the grooves 51a, 53a, 82a, 210-3a and hence the electronic-part storage rod 73A is disposed in the predetermined rotation direction.

Figure 15C:
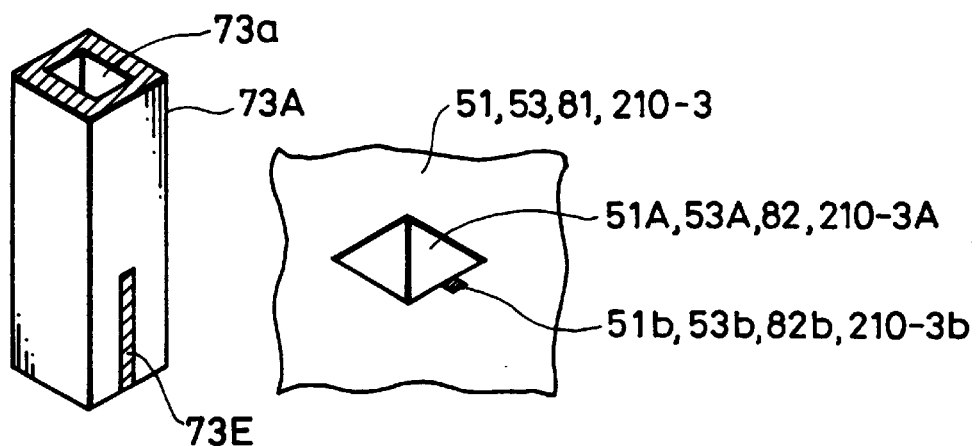

An electronic-part storage rod 73A shown in FIG. 15C has an indication 73E on its outer periphery surface, and indications 51b, 53b, 82b, 210-3b are respectively provided around the apertures 51A, 53A, 82 and 210-3A of the top plate 51, the middle plate 53, the top plate 81 and the supporting plate 210-3. When the electronic-part storage rod 73A is inserted into the apertures 51A, 53A, 82, 210-3A, the indication 73E is agreed with the indications 51b, 53b, 82b, 210-3b and hence the electronic-part storage rod 73A is disposed in the predetermined rotation direction.

According to the present invention, since the adhesive is manually coated on the printed-wiring board 50 by using the manual adhesive coating apparatus, it is advantageously possible to simplify and downsize the manual electronic-part mounting apparatus.

According to the present invention, since the chip-type electronic parts 75 are manually mounted on the printed-wiring board 50 by using the manual electronic-part fitting apparatus, it is advantageously possible to simplify and downsize the manual electronic-part mounting apparatus.

According to the present invention, since it is possible to manually check whether or not the chip-type electronic parts are mounted on the predetermined positions of the printed-wiring board 50 by using the manual electronic-part checking apparatus, it is advantageously possible to simplify and downsize the manual electronic-part mounting apparatus.

According to the present invention, since a large number of chip-type electronic parts 75 can be mounted on the printed-wiring board 50 simultaneously, it is advantageously possible to improve efficiency of the electronic-part mounting process as compared with a process of mounting the chip-type electronic parts 75 one by one.

According to the present invention, since a large number of chip-type electronic parts 75 mounted on the printed-wiring board 50 can be checked simultaneously, it is advantageously possible to improve efficiency of the electronic-part checking process as compared with a process of checking the chip-type electronic parts 75 one by one.

According to the present invention, even if the number of the electronic parts 75 to be mounted on one printed-wiring board 50 is increased, then it is possible to simultaneously mount a large number of chip-type electronic parts 75 and to simultaneously check them. Therefore, the electronic-part mounting process is prevented from taking a long period of time.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A manual electronic-part fitting apparatus comprising:
    a fixed plate;
    a movable plate which can be moved relative to said fixed plate;
    a supporting plate for supporting a printed-wiring board; and
    a plurality of electronic-part supply rods, wherein said electronic-part supply rod incorporates an electronic-part storage rod having an aperture for storing a large number of chip elements piled in a line and an extruding rod disposed in said aperture, and wherein said electronic-part storage rod is fixedly supported by said fixed plate so that a first end portion thereof is located in the vicinity of a surface of a printed-wiring board supported by said supporting plate, said extruding rod is supported by said movable plate, and when said movable plate is moved relative to said fixed plate, said extruding rod is moved into the aperture of said electronic-part storage rod so that the chip element is ejected from the side of said first end portion of said aperture.

2. A manual electronic-part fitting apparatus according to claim 1, wherein said supporting plate is fitted to said fixed plate so that it can be pivotally moved.

3. A manual electronic-part fitting apparatus according to claim 1, wherein said electronic-part storage rod is extended through an aperture provided through said fixed plate.

4. A manual electronic-part fitting apparatus according to claim 3, wherein by changing positions of apertures of said fixed plate, positions of said electronic-part supply rods can be changed.

5. A manual electronic-part fitting apparatus according to claim 1, wherein said extruding rod is biased by a spring and said chip element is ejected from the side of said first end portion of the aperture of said electronic-part supply rod by a spring force of said spring influencing said extruding rod.

6. A manual electronic-part fitting apparatus comprising:
    a supporting member for supporting a printed-wiring board;
    a top plate disposed above said printed-wiring board and having a plurality of apertures; and an electronic-part supply rod fixedly supported in the electronic-part fitting apparatus, wherein said electronic-part supply rod incorporates an electronic-part storage rod having an aperture for storing a plurality of chip elements piled in a line therein and an extruding rod disposed in said aperture, and wherein said electronic-part storage rod is inserted into the aperture of said top plate so that a first end portion thereof is located in the vicinity of a surface of said printed-wiring board supported by said supporting plate, and said extruding rod is moved into the aperture of said electronic-part storage rod, thereby the chip element is ejected from the side of said first end portion of said aperture.

7. An electronic-part fitting method comprising the steps of:

providing a plurality of electronic-part supply rods each having an aperture for storing a plurality of chip elements piled in line therein and an extruding rod disposed in said aperture;

fixedly supporting said electronic-part storage rod so that a first end portion of said electronic-part storage rod is located adjacent to a surface of a printed-wiring board; and moving said extruding rod into the aperture of said electronic-part storage rod to thereby eject the chip element from the side of said first end portion of said aperture.

8. An electronic-part fitting method according to claim 7, wherein said electronic-part storage rod is fitted to a fixed plate, said extruding rod is fitted to a movable plate, and said movable plate is moved relative to said fixed plate so that the chip element is ejected from the side of said first end portion of said aperture.

* * * * *